United States Patent
Lespinats et al.

(10) Patent No.: US 11,336,225 B2
(45) Date of Patent: May 17, 2022

(54) METHOD FOR DETERMINING A CORRECTED CURRENT-VOLTAGE CHARACTERISTIC CURVE OF AN ELECTRICAL SYSTEM

(71) Applicant: Commissariat A L'Energie Atomique et aux Energies Alternatives, Paris (FR)

(72) Inventors: Sylvain Lespinats, Aix-les-Bains (FR); Mohamed Amhal, Chambery (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 249 days.

(21) Appl. No.: 16/691,674

(22) Filed: Nov. 22, 2019

(65) Prior Publication Data

US 2020/0169220 A1 May 28, 2020

(30) Foreign Application Priority Data

Nov. 28, 2018 (FR) ...................... 1871975

(51) Int. Cl.
*H02S 50/10* (2014.01)
*H02S 40/30* (2014.01)

(52) U.S. Cl.
CPC .............. *H02S 50/10* (2014.12); *H02S 40/30* (2014.12)

(58) Field of Classification Search
CPC .................................. H02S 40/30; H02S 50/10
USPC .................................................... 324/761.01
See application file for complete search history.

(56) References Cited

U.S. PATENT DOCUMENTS

| 4,999,524 A * | 3/1991 | Williams | ................... G05F 1/62 307/54 |
| 10,027,279 B2 * | 7/2018 | Lespinats | ............ G01R 31/1263 |
| 10,073,129 B2 * | 9/2018 | Chaintreuil | .............. H02H 3/16 |
| 2011/0267721 A1 * | 11/2011 | Chaintreuil | ............. G01R 31/28 361/2 |

(Continued)

FOREIGN PATENT DOCUMENTS

JP        58-077672 A        5/1983

OTHER PUBLICATIONS

French Preliminary Search Report dated Aug. 19, 2019 in French Application 18 71975 filed on Nov. 28, 2018 (with English Translation of Categories of Cited Documents & Written Opinion).

(Continued)

*Primary Examiner* — Pedro J Cuevas
(74) *Attorney, Agent, or Firm* — Oblon, McClelland, Maier & Neustadt, L.L.P.

(57) ABSTRACT

A method for determining a corrected current-voltage curve of an electrical system, the method including the following steps: obtaining a first current-voltage characteristic curve of the electrical system, by varying the voltage across its terminals at a first measurement rate, obtaining a second current-voltage characteristic curve of the electrical system, by varying the voltage across its terminals at a second measurement rate, different from the first rate, using a single notional capacitance to model an intrinsic stray effect to be corrected between an input voltage without the stray effect and the output voltage, determining a correction value representative of the stray effect and a step of determining a corrected current value on the basis of the determined correction value.

14 Claims, 5 Drawing Sheets

(56) References Cited

U.S. PATENT DOCUMENTS

| | | | | |
|---|---|---|---|---|
| 2011/0301772 | A1* | 12/2011 | Zuercher | H01L 31/02021 |
| | | | | 700/293 |
| 2012/0198591 | A1* | 8/2012 | Ohnesorge | H01L 29/0676 |
| | | | | 850/23 |
| 2012/0318320 | A1* | 12/2012 | Robbins | H02H 1/0015 |
| | | | | 136/244 |
| 2015/0357972 | A1* | 12/2015 | Lespinats | H02H 1/0023 |
| | | | | 324/761.01 |
| 2016/0003883 | A1* | 1/2016 | Chaintreuil | G01R 31/52 |
| | | | | 361/42 |
| 2020/0151379 | A1* | 5/2020 | Lespinats | G06F 30/00 |

OTHER PUBLICATIONS

Spertino, F, et al., "PV Module Parameter Characterization From the Transient Charge of an External Capacitor", IEEE Journal of Photovoltaics, vol. 3, No. 4, 2013, pp. 1325-1333.

\* cited by examiner

METHOD FOR DETERMINING A CORRECTED CURRENT-VOLTAGE CHARACTERISTIC CURVE OF AN ELECTRICAL SYSTEM

TECHNICAL FIELD OF THE INVENTION

The present invention relates to a method for determining a corrected current-voltage characteristic curve of an electrical system.

The electrical system may in particular be a photovoltaic system, such as a photovoltaic cell, a photovoltaic module having a plurality of photovoltaic cells or a string of photovoltaic modules.

The invention also relates to a device for determining the corrected current-voltage curve of an electrical system, said device being able to implement said method.

PRIOR ART

It is known that the operation of certain electrical systems may be characterized by a current-voltage curve, also called I-V curve. Such a curve specifically makes it possible to ascertain the current produced by the electrical system as a function of the voltage that is present across its terminals. It is then possible to track the operating state of the system by establishing its I-V curve from measurements, and possibly to diagnose its operating state on the basis of the curve that is obtained.

It is known in particular to proceed in this way in a photovoltaic system. The presence of a fault in a string of photovoltaic modules specifically hinders the electricity production of the entire string, and therefore of the entire installation. It is therefore necessary to monitor the operating state of each photovoltaic module of a string in order to spot any possible fault with a module and to mitigate it as quickly as possible.

In order to check the operating state of a module, the majority of solutions are based in particular on analysing I-V curves. This is the case for example in the solutions described in patent applications US2015/094967A1, WO2012/128807A1, FR2956213A1, WO2010/118952A1, U.S. Pat. No. 9,048,781B2, JP S58 77672A, US2014/266294A1 and in the publication "SPERTINO FILIPPO et al.: *"PV Module Parameter Characterization from the transient charge of an external capacitor"—IEEE Journal of photovoltaics, IEEE, US*, vol. 3, no. 4, 1 Oct. 2013, pages 1325-1333, XP011527214.

As is known, a photovoltaic module is specifically characterized by a set of reference I-V curves for various levels of insolation (expressed in watts/$m^2$). In other words, for a given level of insolation (called irradiance), a healthy photovoltaic module, that is to say one that is not defective, will theoretically be capable of following one of the reference I-V curves for this level of insolation and temperature. By contrast, if a module exhibits an operating fault, its I-V curve then moves away from this reference curve for this level of insolation and temperature.

In order to perform a reliable diagnosis, it is of course necessary for the measurements to be reliable and for them to correctly reflect the operating state of the monitored photovoltaic system.

Now, it is well known to a person skilled in the art that, in a photovoltaic system, the measurements may be deformed by a set of stray capacitive and inductive effects (in the photovoltaic cells, the modules, the cables, the measurement system, etc.). These stray effects lead to deformations in the measurement data. By way of example, these stray effects may be reflected in a difference between what is called the "outward" I-V curve (curve measured by varying the voltage in a first increasing or decreasing direction) and what is called the "return" I-V curve (curve measured by varying the voltage in the opposite, respectively decreasing or increasing, direction). The capacitive effect is in particular non-negligible, and is greater the shorter the measurement time, for example of the order of 20 ms, to establish the entire I-V curve.

As there is a certain benefit to performing measurements in a very short time, in particular in order to overcome variations in operating conditions (temperature, insolation for a photovoltaic system), in order not to have to disrupt the normal operation of the installation by disconnecting the inverter, in order to limit as far as possible the associated energy losses and in order to avoid Joule losses causing heat dissipation, it proves necessary to obtain reliable I-V curves.

Moreover, it may be noted that previous known solutions are often not applicable when it is desired to obtain a complete I-V curve that is sufficiently sampled and measured over a very short time (for example for the purpose of diagnostics based on the I-V curve).

The aim of the invention is therefore to propose a solution that makes it possible to characterize the stray effects that occur during an I-V measurement on an electrical system, in order to obtain an I-V curve that is corrected and able to be used, for example in order to diagnose the system.

The solution of the invention may in particular be adapted to an electrical system such as a photovoltaic system. It has a certain advantage when the measurement time is particularly short, of the order of 20 ms.

DISCLOSURE OF THE INVENTION

This aim is achieved by a method for determining a corrected current-voltage curve of an electrical system that has two terminals and that is intended to deliver an electric current as a function of an output voltage between its two terminals, said method comprising the following steps:

Obtaining a first current-voltage characteristic curve of the electrical system, by varying the voltage across its terminals at a first measurement rate, Obtaining a second current-voltage characteristic curve of the electrical system, by varying the voltage across its terminals at a second measurement rate, different from the first rate, Determining a plurality of voltage operating points belonging both to the first current-voltage curve and to the second current-voltage curve, Using a single notional capacitance to model an intrinsic stray effect to be corrected between an input voltage without said stray effect and said output voltage, Said method comprising, for each voltage operating point, a step of determining a correction value representative of said stray effect and a step of determining a corrected current value on the basis of the determined correction value.

According to one particular feature, the first current-voltage curve is obtained by varying the voltage in the increasing direction and the second current-voltage curve is obtained by varying the voltage in the decreasing direction.

According to another particular feature, the electrical system is photovoltaic and the method comprises:

For each voltage operating point that is obtained, a step of determining, on the basis of the first current-voltage curve, a first current and a first voltage variation slope as a function of time and a step of determining, on the basis of the second current-voltage curve, a second current and a second voltage variation slope as a function of time, For each voltage operating point, said correction value being determined on the basis of said first current, of said first slope, of said second current and of said second slope.

According to another particular feature, said correction value of said stray effect is expressed by the following relationship:

$$g(V) = \frac{I_A(V) - I_R(V)}{\frac{dV_R}{dt}(V) - \frac{dV_A}{dt}(V)}$$

in which
g(V) corresponds to said stray effect to be eliminated;
$I_A(V)$ corresponds to said first current;
$I_R(V)$ corresponds to said second current;

$$\frac{dV_A}{dt}(V)$$

corresponds to said first slope;

$$\frac{dV_R}{dt}(V)$$

corresponds to said second slope.

According to another particular feature, the step of determining a plurality of voltage operating points belonging both to the first current-voltage curve and to the second current-voltage curve is implemented by using an interpolation method.

The invention also relates to a device for determining a corrected current-voltage curve of an electrical system that has two terminals and that is intended to deliver an electric current as a function of an output voltage between its two terminals, said device having:

Means for measuring a first current-voltage characteristic curve of the electrical system, by varying the voltage across its terminals at a first measurement rate, Means for measuring a second current-voltage characteristic curve of the electrical system, by varying the voltage across its terminals at a second measurement rate, different from the first measurement rate, A module for determining a plurality of voltage operating points belonging both to the first current-voltage curve and to the second current-voltage curve, A module for using a single notional capacitance to model a stray effect to be corrected between an input voltage without said stray effect and said output voltage, Said device executing, for each voltage operating point, a module for determining a correction value representative of said stray effect and a module for determining a corrected current value on the basis of the determined correction value.

According to one particular feature, the first current-voltage curve is obtained by varying the voltage in the increasing direction and the second current-voltage curve is obtained by varying the voltage in the decreasing direction.

According to another particular feature, the electrical system is photovoltaic and the device has:

For each voltage operating point that is obtained, a module for determining, on the basis of the first current-voltage curve, a first current and a first voltage variation slope as a function of time and a module for determining, on the basis of the second current-voltage curve, a second current and a second voltage variation slope as a function of time, and For each voltage operating point, said correction value being determined on the basis of said first current, of said first slope, of said second current and of said second slope.

According to another particular feature, said correction value of said stray effect is expressed by the following relationship:

$$g(V) = \frac{I_A(V) - I_R(V)}{\frac{dV_R}{dt}(V) - \frac{dV_A}{dt}(V)}$$

in which:
g(V) corresponds to said stray effect to be eliminated;
$I_A(V)$ corresponds to said first current;
$I_R(V)$ corresponds to said second current;

$$\frac{dV_A}{dt}(V)$$

corresponds to said first slope;

$$\frac{dV_R}{dt}(V)$$

corresponds to said second slope.

According to another particular feature, the module for determining a plurality of voltage operating points belonging both to the first current-voltage curve and to the second current-voltage curve is configured so as to implement an interpolation method.

The invention also relates to the use of the method as defined above in order to determine the current-voltage characteristic curve of a photovoltaic electrical system.

BRIEF DESCRIPTION OF THE FIGURES

Other features and advantages will become apparent in the following detailed description that is provided with reference to the appended drawings, in which.

DETAILED DESCRIPTION OF AT LEAST ONE EMBODIMENT

The invention aims to obtain a corrected curve I*-V of an electrical system 1, this corrected curve I*-V reflecting the actual operating state of the electrical system. Actual operating state is intended to mean the operating state minus the stray capacitive and inductive effects liable to disrupt the measurements and therefore distort the potential diagnostics to be performed on the system.

Figure 1:
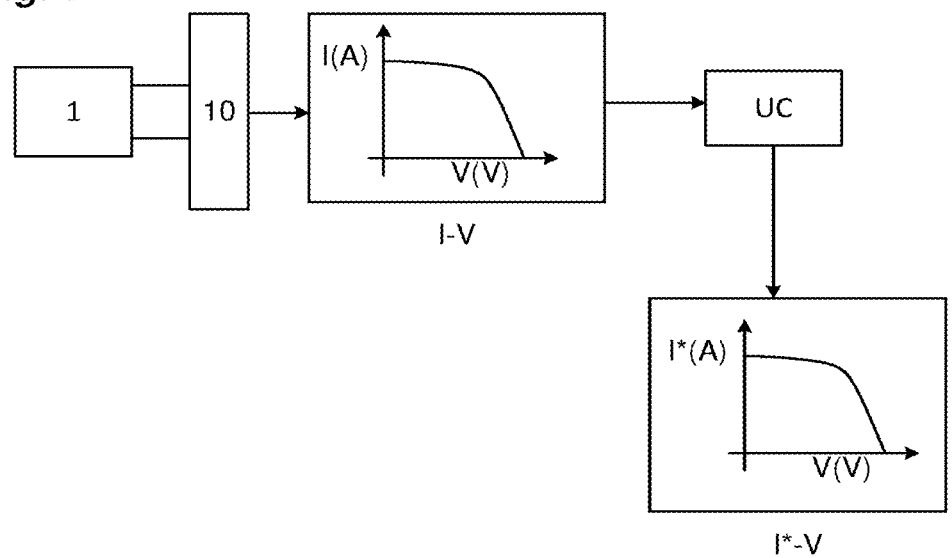
FIG. 1 schematically illustrates the operating principle of the invention.

The method of the invention is implemented by virtue of a particular device that in particular has calculation means grouped into a control and processing unit UC and that has current-voltage measurement means 10 across the terminals of the monitored electrical system. FIG. 1 thus shows the various means of the device for obtaining the desired corrected curve I*-V.

Without limitation, it is considered that the electrical system under consideration is a photovoltaic system. Photovoltaic system is understood to mean a photovoltaic cell, a set of several photovoltaic cells that are connected to one another (in series and/or parallel), a photovoltaic module or a string of photovoltaic modules.

Figure 2:
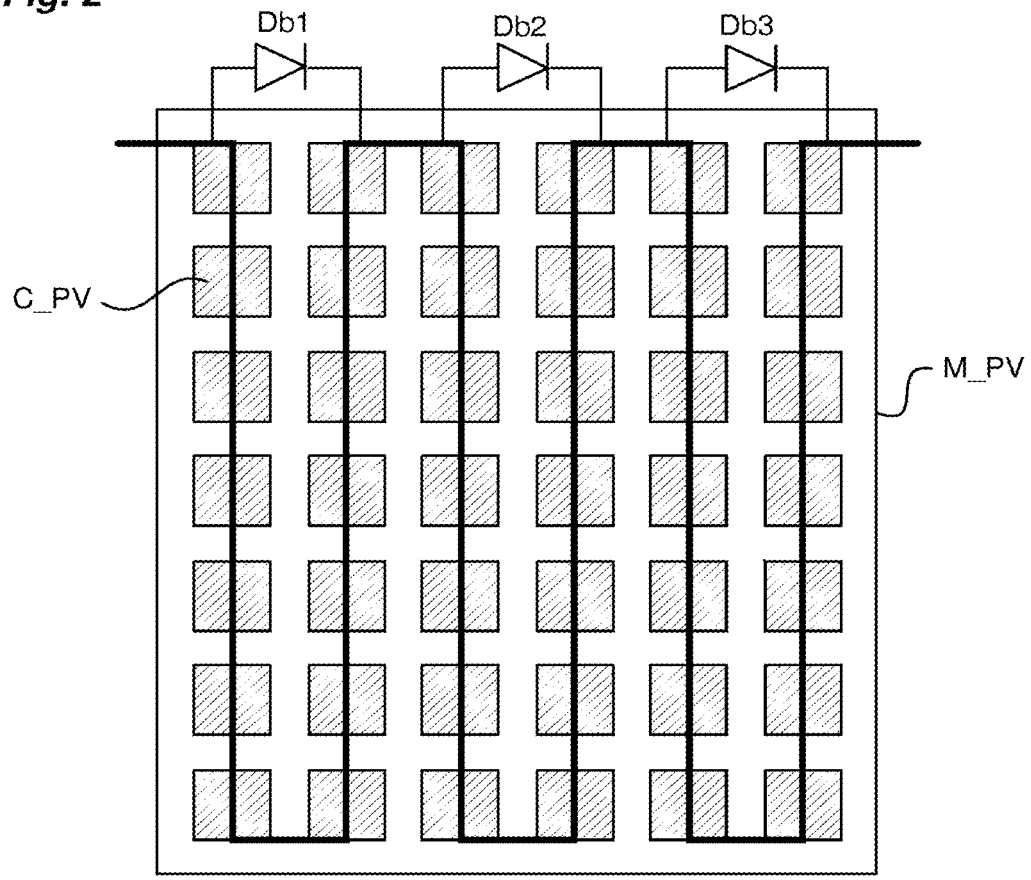
FIG. 2 schematically shows a photovoltaic module.

Without limitation and by way of example, FIG. 2 shows a photovoltaic module M_PV formed of a plurality of photovoltaic cells C_PV. This FIG. 2 thus contains:

The photovoltaic cells that are organized into a plurality of submodules. Two rows of cells form a submodule.

A separate bypass diode (as it is commonly known) Db1, Db2, Db3 is associated with each submodule that is shown. In FIG. 2, a submodule is shown with a plurality of cells, but it could have just a single cell. The bypass diode is intended to bypass the submodule in the event of a failure of one or more cells in the submodule.

Figure 3A:
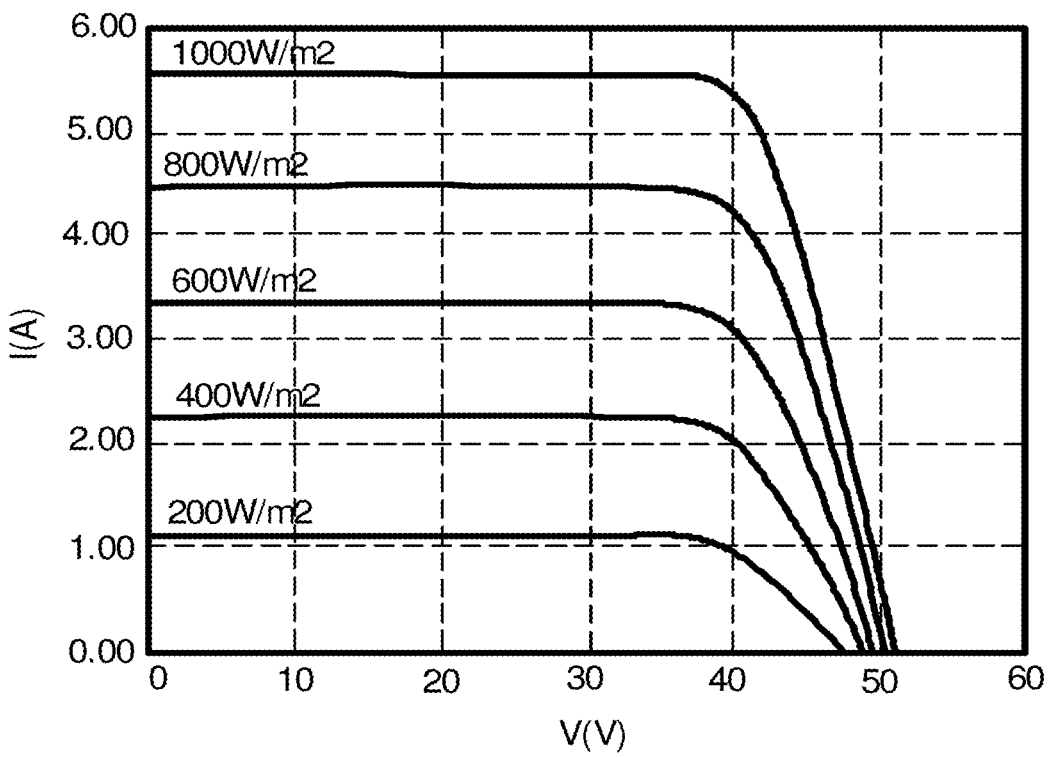
FIG. 3A shows the reference I-V curves of a photovoltaic system and FIG. 3B shows two I-V curves of a photovoltaic system, respectively when the system is fault-free and when the system is defective.

As explained above, the performance of such a photovoltaic system (in this case a photovoltaic module) is characterized by a set of current-voltage curves, hereinafter termed I-V curves. FIG. 3A shows the reference I-V characteristic curves of a photovoltaic module for various levels of insolation, called irradiance or radiation and expressed in $W/m^2$.

As is known, the total voltage of a string of photovoltaic modules is given by the sum of the voltages across the terminals of each module (including those across the terminals of the cables and connectors). In the same way, the voltage of a module is given by the sum of the voltages across the terminals of each cell that forms the module, since the photovoltaic module is formed of a plurality of cells placed in series. Each group of cells is moreover protected by a bypass diode. The voltages may be different across the terminals of each module if the modules have different I-V characteristics. By contrast, even if the modules of one and the same string have different I-V characteristics, the operation of the string will be such that the current of the string flowing through each module M_PV of the string remains the same. If a cell is defective and exhibits a hotspot risk ("hotspot"—operation in load mode that leads to a very high temperature), the bypass diode that protects the cell group in question makes it possible to channel the additional current that the defective cell is not able to handle. The total current supplied by the system is the sum of the currents flowing through each string of the architecture.

Figure 3B:
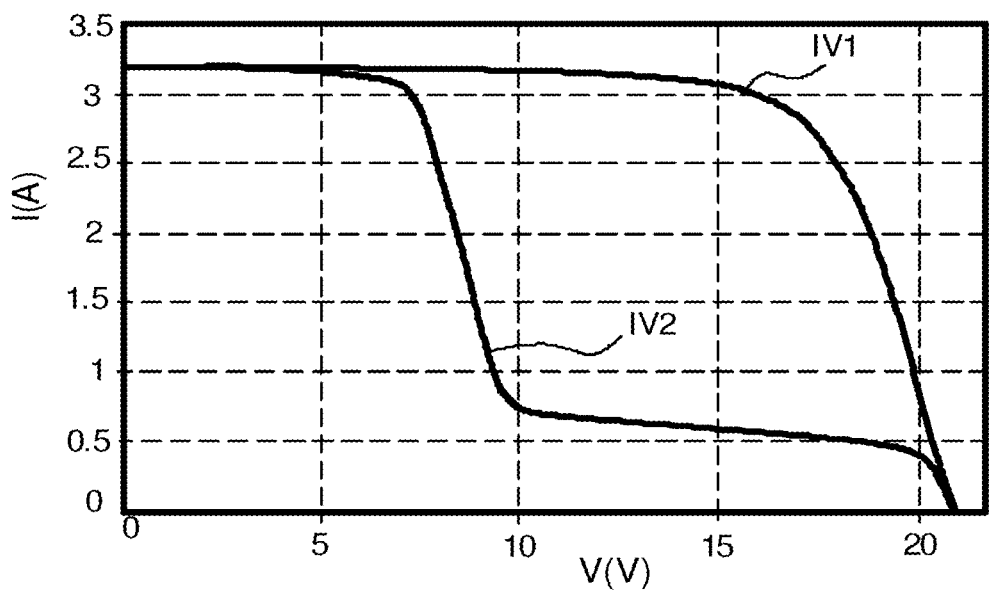

FIG. 3B shows, for one and the same photovoltaic module, the I-V curve, referenced IV1, obtained when the photovoltaic module is healthy (fault-free) and the I-V curve, referenced IV2, obtained when the module is defective. It may in particular be seen that the curve IV2 is deformed in comparison with the curve IV1 and deduced therefrom that the I-V curve measured for a module makes it possible to determine its operating state.

The importance of monitoring the operating state of a photovoltaic system (cell, module, string of cells, strings of modules, etc.) and of implementing a method that makes it possible, for this system, to obtain an I-V curve on the basis of which it is possible to establish a reliable diagnosis, is thus understood.

In electricity, electronic components such as the capacitive element and the inductance respond to the variation in the current and in the voltage. When taking any electrical system, it is possible, in this system, to find stray capacitances and stray inductances that disrupt its output signal in response to another input signal. One typical example is that of electrical cables in which the stray inductance and stray capacitance are proportional to the length and the cross section of the cables, to the type of insulation and to the distance to ground and to other sources of potentials. In photovoltaic systems, this phenomenon is present to a great extent and is reflected in disruptions in the I-V curve measurement.

As explained above, the solution of the invention aims to correct the I-V measurements that are performed by eliminating the stray effects generated during the measurements. The principle has a certain benefit due to the fact that the I-V measurements are performed on the photovoltaic system in a very short time, for example of the order of 20 ms. In this situation, the stray effects may specifically be greater than when the measurement duration is longer (several seconds for example). It is however necessary to consider that the invention may apply to all measurement situations, but the correction to be applied tends to be less significant (for a given cell technology) when the measurement duration is longer.

Figure 4A:
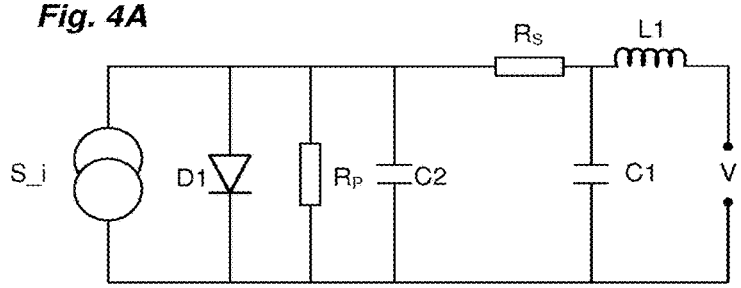
FIGS. 4A and 4B show two equivalent circuit diagrams of the stray effects present in a photovoltaic system during an I-V measurement.
Figure 4B:
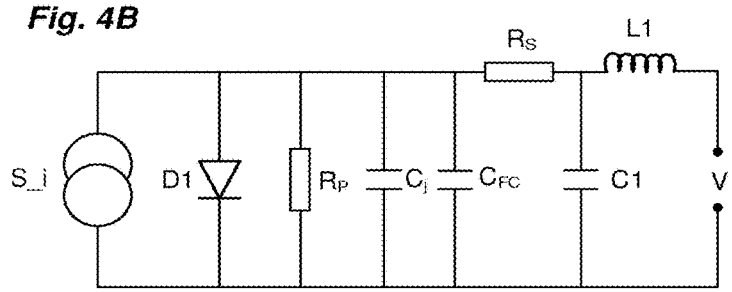

FIGS. 4A and 4B show two circuit diagrams of a photovoltaic electrical system 1.

Specifically, it is conventional to use equivalent models to model all types of photovoltaic system. In FIG. 4A, the model contains a current source S_i, a diode D1, a parallel resistor Rp and a series resistor Rs modelling its operation. It also incorporates a capacitor whose capacitance C2 simulates a capacitive effect present in the photovoltaic system. In FIG. 4B, the model contains two capacitors in parallel, so as to model the two capacitances of the photovoltaic system, that is to say the junction capacitance Cj due to the junction (layer separating the + and − zones) of the photovoltaic cells and the free charge capacitance $C_{FC}$ due to the positive and negative free charges on both sides of the junction of the photovoltaic cells. In the two diagrams, a capacitor with a capacitance C1, an inductor L1 and a resistor R1 have been added in order to model the electrical cables and the power electronics components of the photovoltaic system under consideration.

Figure 5:
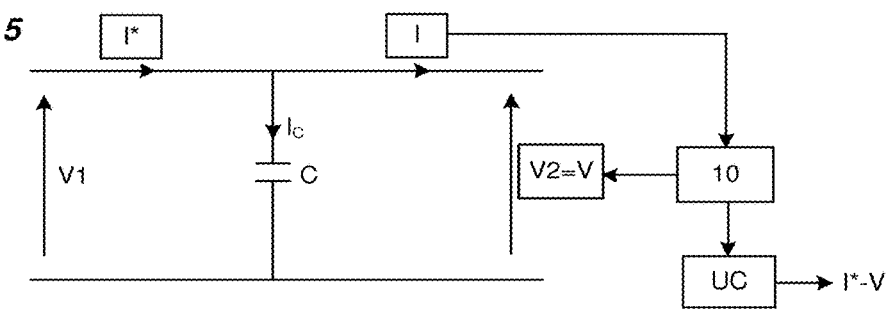
FIG. 5 shows a circuit diagram of the stray effects present in a photovoltaic system during an I-V measurement, said diagram being simplified in comparison with the diagrams in FIGS. 4A and 4B.

One of the principles of the invention consists in modifying the conventional equivalent circuit diagram of a photovoltaic system as defined above in connection with FIGS. 4A and 4B (that is to say model with a diode having a capacitive effect). The equivalent circuit diagram is intended to show only the intrinsic stray effect of the photovoltaic system that occurs during the I-V measurements that are performed. This simplified equivalent diagram is shown in FIG. 5.

In this equivalent circuit diagram, the system is thus defined by a first voltage V1 that corresponds to the voltage of the system, minus any intrinsic stray (in particular capacitive) effect of the system, a capacitive element with a capacitance C that is connected in parallel with said first voltage V1 and that represents, overall, the intrinsic stray effect liable to disrupt the measurements, and a second voltage V2 that corresponds to the actual voltage supplied by the system and including said intrinsic stray effect. It is thus possible to directly manipulate the electrical equations across the terminals of the capacitive element, without having to ascertain the values of the series resistor Rs and of the inductor L1 described above.

In order to characterize the system and thus obtain an I-V curve, the voltage across the terminals of the photovoltaic system is varied and the current obtained for each applied voltage operating point is measured. A current-voltage characteristic curve (I-V curve) of the system is thus obtained.

Due to the presence of the capacitance C, the deformation of the measured I-V curve depends on the direction (increasing or decreasing) and on the rate of variation of the voltage. In other words, in the context of the invention, this involves obtaining a first I-V curve at a first (positive or negative) measurement rate and then a second I-V curve at a second (positive or negative) measurement rate, different from the first measurement rate. Two I-V curves with different dynamics are thereby obtained.

For the remainder of the description and without limitation, it is thus possible to draw a distinction between two measurement directions: the direction of the decreasing voltage (hereinafter arbitrarily denoted as the "outward" direction), and the direction of the increasing voltage (hereinafter arbitrarily denoted as the "return" direction). In this case, there will thus be the sum of the first measurement rate and the second measurement rate that is zero.

In order to estimate the corrected characteristic curve I*-V, that is to say without the stray effect, the electrical equations applied to the simplified equivalent circuit diagram defined above in connection with FIG. 5 are used.

The below equations respectively describe the node law and the mesh law applied to the terminals of the capacitive element C:

$$I^* = I - I_c \tag{1}$$

$$I_c = \frac{d(C \times V)}{dt} = \frac{dC}{dt} \times V + C \times \frac{dV}{dt} \tag{2}$$

where:

I* corresponds to the current without the stray effect;
I corresponds to the current incorporating the stray effect;
Ic corresponds to the current flowing through the capacitive element in the equivalent diagram;
C corresponds to the capacitance of the capacitive element;
V corresponds to the voltage of each voltage operating point, incorporating the stray effect, and corresponds to the voltage V2 described above.

The capacitance C is an apparent capacitance the value of which changes as a function of the voltage V. For ease of mathematically manipulating the equations, it is assumed that the capacitance C is written in the form of a continuous and differentiable function (i.e. of the class $C^1$) of the voltage V. This scenario is confirmed in the case of the photovoltaic field of application. It is thus the case that:

$$C = f(V) \tag{3}$$

Combining equations (2) and (3) gives:

$$I_c = f'(V) \times V \times \frac{dV}{dt} + f(V) \times \frac{dV}{dt} \tag{4}$$

Equation (4) may be written in the form:

$$I_c = g(V) \times \frac{dV}{dt} \tag{5}$$

where:

$$g(V) = f'(V) \times V + f(V) \tag{6}$$

The variable g(V) has the dimension of a capacitance. It may thus be stated that this function corresponds to a corrected capacitance of the capacitance C.

Combining equations (1) and (5) gives:

$$I^* = I - g(V) \times \frac{dV}{dt} \tag{7}$$

Applying equation (7) to the outward and return curves ($I_A$-$V_A$ and $I_R$-$V_R$) gives:

$$I^*(V_A) = I_A(V_A) - g(V_A) \times \frac{dV_A}{dt}(V_A) \tag{8}$$

$$I^*(V_R) = I_R(V_R) - g(V_R) \times \frac{dV_R}{dt}(V_R) \tag{9}$$

The system of equations (8) and (9) is a system with two equalities and with two unknowns. In order to be able to solve it, it may be necessary to re-evaluate the functions $I_R(V_R)$, $I_A(V_A)$, $dV_R/dt^*(V_R)$ and $dV_A/dt^*(V_A)$ at the same voltage operating points. Once this has been performed, the solution to the equation system is obtained using equations (10) and (11) below:

$$g(V) = \frac{I_A(V) - I_R(V)}{\frac{dV_R}{dt}(V) - \frac{dV_A}{dt}(V)} \tag{10}$$

$$I^* = I(V) - g(V) \times \frac{dV}{dt}(V) \tag{11}$$

According to one particular aspect of the invention, it may be noted that the equations described above may also make it possible to determine the value of the capacitance C of the equivalent diagram, taking into account the calculation of g(V). The value of the capacitance C, defined by the relationship C=f(V), may be obtained by solving the differential equation (12) below. The solution to this equation is written in the form described by equation (13):

$$f(V) + V \cdot f'(V) = g(V) \qquad (12)$$

$$C = f(V) = \frac{\Gamma(V) + \Gamma_0}{|V|} \qquad (13)$$

where $\Gamma F_0$ is a constant determined by the initial conditions, and $\Gamma$ is the primitive of the function $g(V)$.

By applying the principles of the invention that are described above, the corrected curve that is obtained is therefore a curve without a stray effect and in which the outward and return curves are superimposed. The stray effects, which tend to shift the return curve upwards and shift the outward curve downwards, disappear completely in the corrected I-V curve, and the two outward and return curves become one after the correction.

It is noted here that knowing the equivalent circuit diagram is not necessary in order to correct the stray effect, since the invention proposes rewriting the circuit diagram, which makes it possible to make the stray effect independent from the rest of the system.

Figure 6:
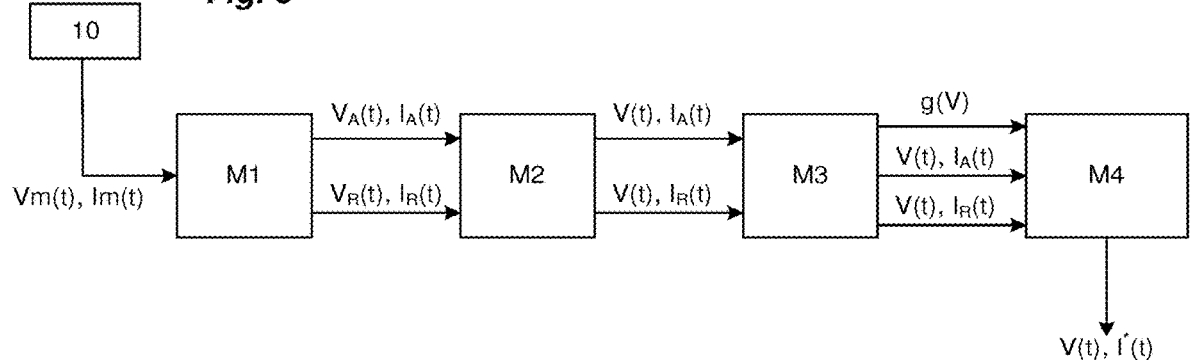
FIG. 6 shows a diagram illustrating the operating principle of the invention.

FIG. 6 thus illustrates the main steps that are implemented in order to arrive at the desired corrected curve I*-V.

In a first step, implemented by the control and processing unit UC, the method consists in commanding the measurement means 10 of the device so as to gather the current data as a function of the voltage. As already described above, the measurements may be performed in a very short time, for example of the order of 20 ms, thereby making it possible not to disrupt the operation of the photovoltaic system or to have to take into account variations in environmental conditions (insolation, temperature, etc.). The measurement data that are obtained are referenced Vm(t) and Im(t). The data are generated in the two directions already defined above, that is to say in the outward direction (increasing voltage) and in the return direction (decreasing voltage).

In a second step, the control and processing unit then processes these data. A first module M1 of the control and processing unit UC is charged with separating the data that are obtained in order to generate the outward curve and the return curve. The outward curve is thus defined by the measurement data $V_A(t)$, $I_A(t)$, and the return curve is defined by the measurement data $V_R(t)$, $I_R(t)$.

In a third step, the control and processing unit UC executes a module M2 for unifying the voltage operating points on the two outward and return curves. Thus, for each voltage operating point V, the control and processing unit UC has a current value belonging to the output curve and a current value belonging to the return curve. To perform this unification, the module M3 may need to implement the interpolation principle explained above. The control and processing unit UC thus has data V(t), $I_A(t)$ for the outward curve and data V(t), $I_R(t)$ for the return curve.

In a fourth step, the control and processing unit UC executes a module M3 for determining the correction value to be applied for each voltage operating point, this correction value being defined by the function $g(V)$ expressed in relationship (10) above.

In a fifth step, the control and processing unit UC executes a module M4 charged with determining the corrected curve I*-V by applying the correction value identified for each voltage operating point to the corresponding current. The above relationship (11) is thus applied:

$$I^* = I(V) - g(V) \times \frac{dV}{dt}(V)$$

The control and processing unit UC may optionally need to calculate the value of the capacitance C by applying relationship (13) explained above.

To validate the method for correcting the capacitive effect that is proposed above, tests were performed on I-V curves measured on a photovoltaic system. The monitored photovoltaic system is in this case a string of modules that has the characteristics that are summarized in the table below.

| Photovoltaic system | String formed of 14 PV modules |
| --- | --- |
| Technology | Polycrystalline |
| Peak power per module | 205 Wc |
| Open-circuit voltage per module | 32.7 V |
| Short-circuit current per module | 8 A |
| Number of bypass diodes per module | 3 |
| Number of cells per module | 60 |
| Conditions | Outdoor |
| Duration of the trace of the curve | 20 ms |

Figure 7:
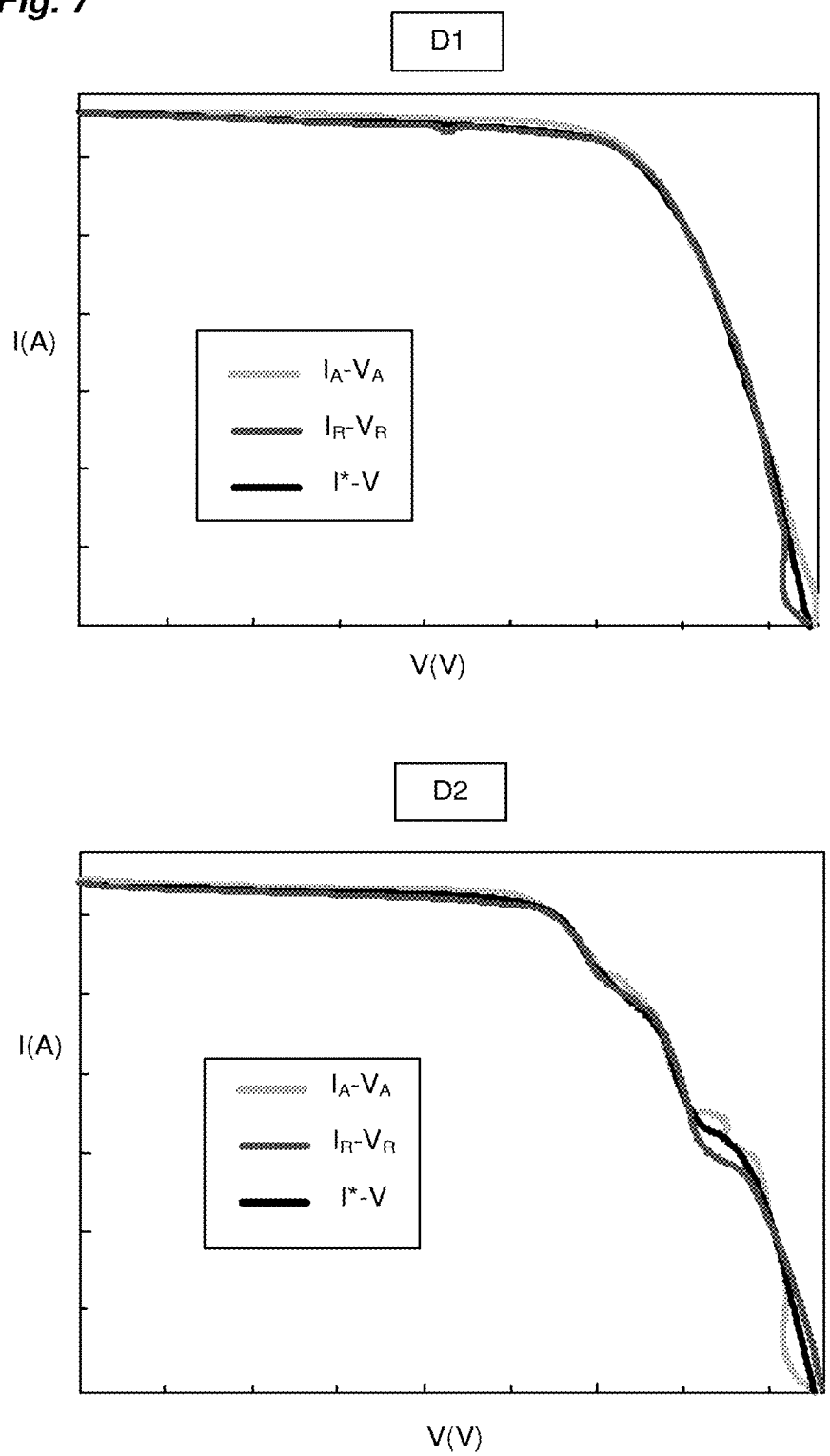
FIGS. 7 and 8 show a plurality of graphs illustrating the reliability and the effectiveness of the solution of the invention.

The principle of the invention described above is applied in order to correct I-V curves measured over a very short period (of the order of 20 ms). The two graphs D1, D2 in FIG. 7 are then obtained. Graph D1 in FIG. 7 is a case in which the studied photovoltaic system is not subject to shading, and graph D2 is a case in which the photovoltaic system is subject to shading.

It is able to be seen in these two graphs D1, D2 that the two curves $I_A$-$V_A$ and $I_R$-$V_R$ measured in the outward direction and in the return direction are not superimposed. This is due to the presence of a capacitive effect.

The corrected curve I*-V determined by the principle of the invention is also able to be seen in these two graphs.

Figure 8:
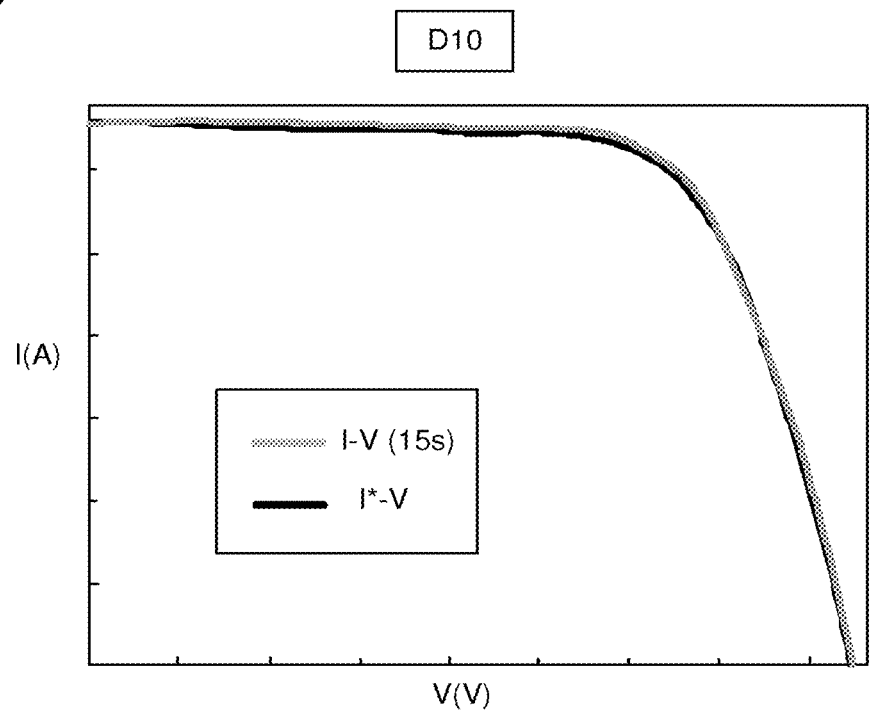
Figure 8:
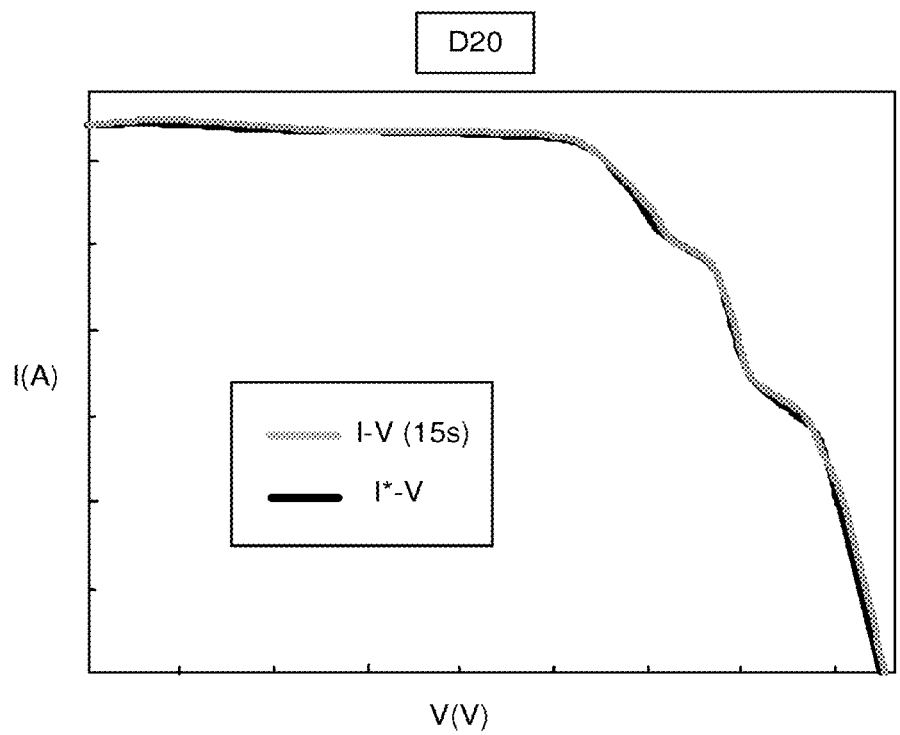

FIG. 8 also shows two graphs D10, D20 (without shading and with shading) each showing the I-V curve obtained after a longer measurement time (of the order of 15 seconds), the latter curve thus being assumed to be without a stray effect (as it is measured over a longer duration—the capacitive effect becoming negligible in this measurement situation). It is thus able to be seen that the corrected curve I*-V follows the measured I-V curve perfectly over the longer duration, showing that the solution of the invention is reliable and even adaptable regardless of the duration taken to measure the I-V curve.

It is understood that the solution of the invention has numerous advantages, among which:
- A solution that is easy to implement,
- A solution that is adaptable regardless of the duration of the I-V measurements that are performed,
- A solution that is adaptable to very short measurement times, thereby making it possible to overcome variations in environmental conditions but also to not disrupt the normal operation of the system (in particular by disconnecting the system in order to perform the measurements), to avoid energy losses and to limit heat dissipation.
- A reliable solution, making it possible to obtain corrected I-V curves able to be used to diagnose the state of the system.

The invention claimed is:

1. A method for determining a corrected current-voltage curve of an electrical system that has two terminals and that is configured to deliver an electric current as a function of an output voltage between its two terminals, comprising the following steps:

obtaining a first current-voltage characteristic curve of the electrical system, by varying the voltage across its terminals at a first measurement rate, obtaining a second current-voltage characteristic curve of the electrical system, by varying the voltage across its terminals at a second measurement rate, different from the first rate, determining a plurality of voltage operating points belonging both to the first current-voltage curve and to the second current-voltage curve, using a single apparent capacitance to model an intrinsic stray effect to be corrected between an input voltage without said stray effect and said output voltage, and wherein for each voltage operating point, a step of determining a correction value representative of said stray effect and a step of determining a corrected current value on the basis of the determined correction value.

2. The method according to claim 1, wherein the first current-voltage curve is obtained by varying the voltage in an increasing direction and in that the second current-voltage curve is obtained by varying the voltage in a decreasing direction.

3. The method according to claim 1, wherein the electrical system is photovoltaic and wherein the method comprises:

for each voltage operating point that is obtained, a step of determining, on the basis of the first current-voltage curve, a first current and a first voltage variation slope as a function of time and a step of determining, on the basis of the second current-voltage curve, a second current and a second voltage variation slope as a function of time, wherein for each voltage operating point, said correction value is determined on the basis of said first current, of said first slope, of said second current and of said second slope.

4. The method according to claim 3, wherein said correction value of said stray effect is expressed by the following relationship:

$$g(V) = \frac{I_A(V) - I_R(V)}{\frac{dV_R}{dt}(V) - \frac{dV_A}{dt}(V)}$$

wherein:
g(V) corresponds to said stray effect to be eliminated;
$I_A(V)$ corresponds to said first current;
$I_R(V)$ corresponds to said second current;

$$\frac{dV_A}{dt}(V)$$

corresponds to said first slope; and $$\frac{dV_R}{dt}(V)$$

corresponds to said second slope.

5. The method according to claim 1, wherein the step of determining a plurality of voltage operating points belonging both to the first current-voltage curve and to the second current-voltage curve is implemented by using an interpolation method.

6. A device for determining a corrected current-voltage curve of an electrical system that has two terminals and that is configured to deliver an electric current as a function of an output voltage between its two terminals, said device comprising:

means for measuring a first current-voltage characteristic curve of the electrical system, by varying the voltage across its terminals at a first measurement rate, means for measuring a second current-voltage characteristic curve of the electrical system, by varying the voltage across its terminals at a second measurement rate, different from the first measurement rate, a module for determining a plurality of voltage operating points belonging both to the first current-voltage curve and to the second current-voltage curve, a module for using a single apparent capacitance to model a stray effect to be corrected between an input voltage without said stray effect and said output voltage, and wherein for each voltage operating point, a module for determining a correction value representative of said stray effect and a module for determining a corrected current value on the basis of the determined correction value.

7. The device according to claim 6, wherein said first current-voltage curve is obtained by varying the voltage in an increasing direction and wherein the second current-voltage curve is obtained by varying the voltage in a decreasing direction.

8. The device according to claim 6, wherein the electrical system is photovoltaic and wherein the device has:

for each voltage operating point that is obtained, a module for determining, on the basis of the first current-voltage curve, a first current and a first voltage variation slope as a function of time and a module for determining, on the basis of the second current-voltage curve, a second current and a second voltage variation slope as a function of time, wherein for each voltage operating point, said correction value is determined on the basis of said first current, of said first slope, of said second current and of said second slope.

9. The device according to claim 8, wherein said correction value of said stray effect is expressed by the following relationship:

$$g(V) = \frac{I_A(V) - I_R(V)}{\frac{dV_R}{dt}(V) - \frac{dV_A}{dt}(V)}$$

wherein:
g(V) corresponds to said stray effect to be eliminated;
$I_A(V)$ corresponds to said first current;
$I_R(V)$ corresponds to said second current;

$$\frac{dV_A}{dt}(V)$$

corresponds to said first slope; and $$\frac{dV_R}{dt}(V)$$

corresponds to said second slope.

10. The device according to claim 6, wherein the module for determining a plurality of voltage operating points belonging both to the first current-voltage curve and to the second current-voltage curve is configured so as to implement an interpolation method.

11. A method of determining a current-voltage characteristic curve of a photovoltaic electrical system, said method comprising the method for determining the corrected current-voltage curve of claim 1.

12. A method for determining a corrected current-voltage curve of an electrical system that has two terminals and that is configured to deliver an electric current as a function of an output voltage between its two terminals, comprising the following steps:

obtaining a first current-voltage characteristic curve of the electrical system, by varying the voltage across its terminals at a first measurement rate, obtaining a second current-voltage characteristic curve of the electrical system, by varying the voltage across its terminals at a second measurement rate, different from the first rate, determining a plurality of voltage operating points belonging both to the first current-voltage curve and to the second current-voltage curve, using a capacitance value to model an intrinsic stray effect of the system, and for each voltage operating point, determining a correction value using the capacitance value and determining a corrected current value on the basis of the determined correction value.

13. The method according to claim 12, wherein the electrical system is photovoltaic and wherein the method comprises:

for each voltage operating point that is obtained, a step of determining, on the basis of the first current-voltage curve, a first current and a first voltage variation slope as a function of time and a step of determining, on the basis of the second current-voltage curve, a second current and a second voltage variation slope as a function of time, wherein for each voltage operating point, said correction value is determined on the basis of said first current, of said first slope, of said second current and of said second slope.

14. The method according to claim 13, wherein said correction value is expressed by the following relationship:

$$g(v) = \frac{I_A(V) - I_R(V)}{\frac{dV_R}{dt}(V) - \frac{dV_A}{dt}(V)}$$

wherein:

g(V) corresponds to said stray effect to be eliminated;

$I_A(V)$ corresponds to said first current;

$I_R(V)$ corresponds to said second current;

$$\frac{dV_A}{dt}(V)$$

corresponds to said first slope; and $$\frac{dV_R}{dt}(V)$$

corresponds to said second slope.

* * * * *